US012622067B2

(12) United States Patent
Chen et al.

(10) Patent No.:  US 12,622,067 B2
(45) Date of Patent:      May 5, 2026

(54) INTEGRATED CIRCUIT FOR POWER CLAMPING

(71) Applicant: REALTEK SEMICONDUCTOR CORP., Hsinchu (TW)

(72) Inventors: Jyun-Ren Chen, Hsinchu (TW); Shih-Hsin Liao, Hsinchu (TW); Po-Ching Lin, Hsinchu (TW); Tay-Her Tsaur, Hsinchu (TW)

(73) Assignee: REALTEK SEMICONDUCTOR CORP., Hsinchu (TW)

( * ) Notice:  Subject to any disclaimer, the term of this patent is extended or adjusted under 35 U.S.C. 154(b) by 420 days.

(21) Appl. No.: 18/143,101

(22) Filed:  May 4, 2023

(65) Prior Publication Data

US 2023/0361108 A1  Nov. 9, 2023

(30) Foreign Application Priority Data

May 5, 2022  (TW) .................................. 111116888

(51) Int. Cl.
*H10D 89/60*  (2025.01)
(52) U.S. Cl.
CPC ......... *H10D 89/813* (2025.01); *H10D 89/611* (2025.01); *H10D 89/911* (2025.01)
(58) Field of Classification Search
CPC .. H10D 89/813; H10D 89/611; H10D 89/911; H10D 89/819
See application file for complete search history.

(56) References Cited

U.S. PATENT DOCUMENTS

| | | | | |
|---|---|---|---|---|
| 2014/0355157 | A1* | 12/2014 | Huang ................... | H02H 9/046 |
| | | | | 361/56 |
| 2015/0070806 | A1* | 3/2015 | Parthasarathy .......... | H02H 9/04 |
| | | | | 361/57 |
| 2016/0087429 | A1* | 3/2016 | Wang ................... | H10D 89/811 |
| | | | | 361/56 |
| 2019/0190256 | A1* | 6/2019 | Agarwal .............. | H02H 1/0007 |
| 2019/0229531 | A1* | 7/2019 | Liao ................... | H10D 89/911 |
| 2020/0365578 | A1* | 11/2020 | Ting ................... | H10D 89/811 |
| 2020/0412124 | A1* | 12/2020 | Sithanandam ....... | H10D 89/811 |

FOREIGN PATENT DOCUMENTS

TW          201947730 A      12/2019

* cited by examiner

*Primary Examiner* — S M Sohel Imtiaz
(74) *Attorney, Agent, or Firm* — Li & Cai Intellectual Property (USA) Office

(57)  ABSTRACT

An integrated circuit for power clamping is provided. The integrated circuit for power clamping is electrically coupled to an internal circuit of an integrated circuit through a power line and a ground line, and includes a switch, a first resistor, a capacitor, an inverter and a voltage detection circuit. The voltage detection circuit detects a voltage of the power line, and when the voltage of the power line exceeds a threshold value, the voltage detection circuit electrically connects a first node to the ground line, such that a low potential signal from the ground line is input to the input terminal of the inverter, and then the switch is turned on to form a discharge path.

11 Claims, 6 Drawing Sheets

INTEGRATED CIRCUIT FOR POWER CLAMPING

CROSS-REFERENCE TO RELATED PATENT APPLICATION

This application claims the benefit of priority to Taiwan Patent Application No. 111116888, filed on May 5, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an integrated circuit (IC), and more particularly to an integrated circuit for power clamping capable of forming a discharge path for an electrical overstress (EOS) event.

BACKGROUND OF THE DISCLOSURE

An integrated circuit (IC) may be provided with a power clamping circuit to form a discharge path for electrostatic discharge (ESD), so as to prevent an ESD surge current from flowing into an internal circuit of the IC and protect the IC from burning out. However, an electrical overstress (EOS) event (also referred to as a system ESD) may occur during normal operation of the IC, and the EOS events typically last in an order of microseconds compared to ESD events, which typically last in an order of nanoseconds. Therefore, it is difficult for the existing integrated circuit for power clamping to form a discharge path for the EOS event to prevent the EOS surge current from flowing into the internal circuit of the IC and burning the IC out.

SUMMARY OF THE DISCLOSURE

In response to the above-referenced technical inadequacies, the present disclosure provides an integrated circuit for power clamping that can form a discharge path for an electrical overstress (EOS) event, so as to prevent an EOS surge current from flowing into an internal circuit of an IC and protecting the IC from burning out.

In one aspect, the present disclosure provides an integrated circuit for power clamping. The integrated circuit for power clamping is electrically coupled to an internal circuit of another integrated circuit through a power line and a ground line, and the integrated circuit for power clamping includes a switch, a first resistor, a capacitor, an inverter and a voltage detection circuit. The switch is electrically coupled between the power line and the ground line. The first resistor is electrically coupled between the power line and the first node. The capacitor is electrically coupled between the first node and the ground line. The inverter is electrically coupled between the first node and the control terminal of the switch. An input terminal of the inverter is electrically coupled to the first node, and an output terminal of the inverter is electrically coupled to the control terminal of the switch.

The voltage detection circuit is electrically coupled to the power line, the first node and the ground line, and is configured to detect a voltage of the power line. In response to detecting that the voltage of the power line exceeds a threshold value, the voltage detection circuit is further configured to electrically connect the first node to the ground line, such that the input terminal of the inverter electrically coupled with the first node is pulled low to activate the switch and forming a discharge path in the switch.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
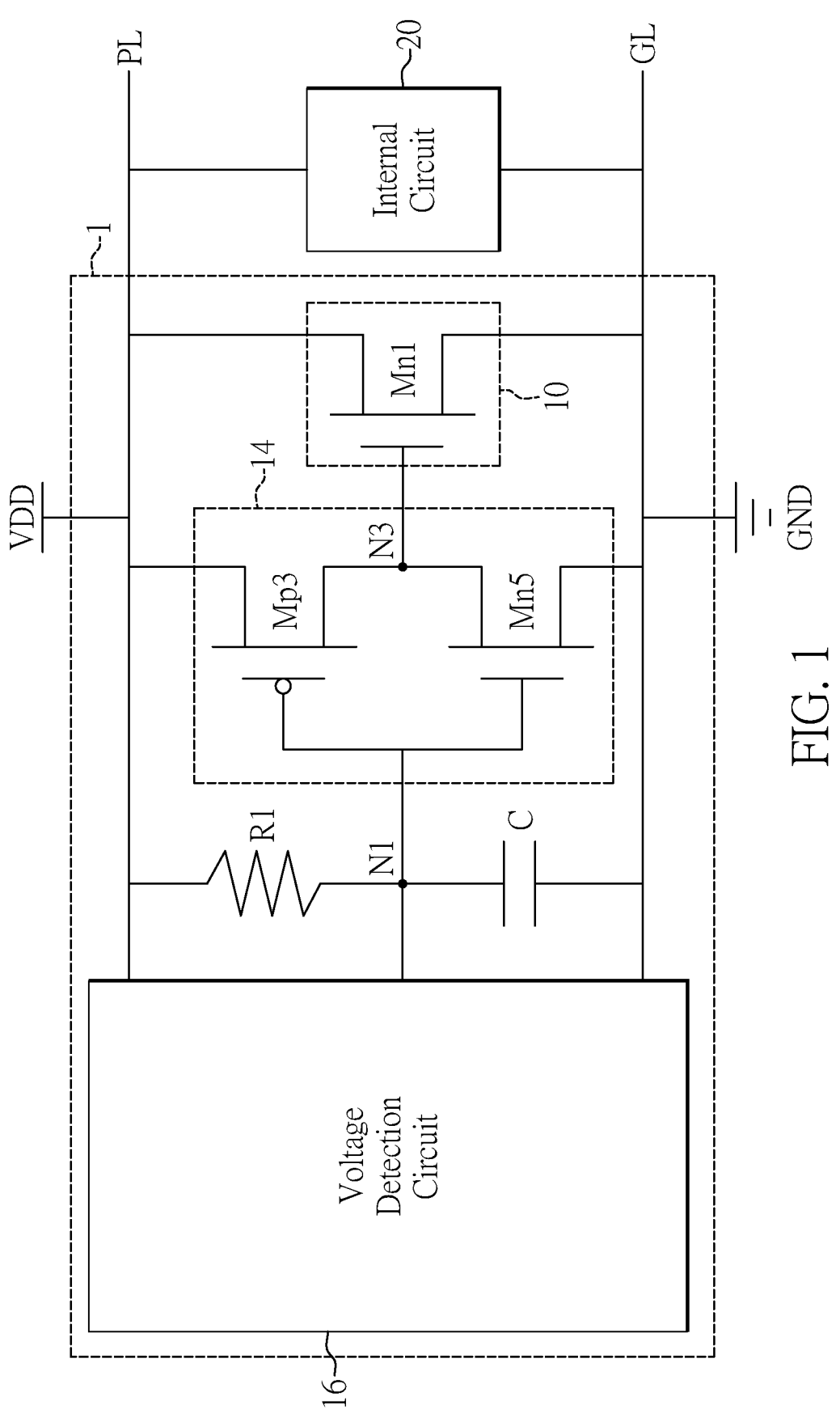
FIG. 1 is a schematic diagram of an integrated circuit for power clamping according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a schematic diagram of an integrated circuit for power clamping according to one embodiment of the present disclosure. The integrated circuit for power clamping 1 is electrically coupled to an internal circuit 20 of another integrated circuit (IC) through a power line PL and a ground line GL. The ground line GL is electrically coupled to the ground voltage GND, and the integrated circuit for power clamping 1 includes a switch 10, a resistor R1, a capacitor C, an inverter 14 and a voltage detection circuit 16. The switch 10 is electrically coupled between the power line PL and the ground line GL. The resistor R1 is electrically coupled between the power line PL and a first node N1. The capacitor C is electrically coupled between the first node N1 and the ground line GL. The inverter 14 is electrically coupled between the first node N1 and a control terminal of the switch 10. The input terminal of the inverter 14 is electrically coupled to the first node N1, and the output terminal of the inverter 14 is electrically coupled to the control terminal of the switch 10. The voltage detection circuit 16 is electrically coupled to the power line PL, the first node N1 and the ground line GL, and is configured to detect whether a voltage of the power line PL exceeds a threshold. When the voltage of the power line PL exceeds the threshold value, the voltage detection circuit 16 further electrically couples the first node N1 with the ground line GL, such that the input terminal of the inverter 14 electrically coupled with the first node N1 is pulled low to activate the switch 10 and forming a discharge path in the switch 10.

Specifically, the switch 10 can be an N-channel metal-oxide-semiconductor field-effect transistor (N-MOSFET) Mn1, a drain of the N-MOSFET Mn1 is electrically coupled to the power line PL, and a source of the N-MOSFET Mn1 is electrically coupled to the ground line GL, and a gate of the N-MOSFET Mn1 is taken as the control terminal electrically coupled to the output terminal of the inverter 14. In other embodiments, the switch 10 can also be an NPN bipolar junction transistor (BJT), a collector of the NPN-BJT is electrically coupled to the power line PL, an emitter of the NPN-BJT is electrically coupled to the ground line GL, and a base of the NPN-BJT is taken as the control terminal electrically coupled to the output terminal of the inverter 14, but the present disclosure is not limited thereto. The present disclosure does not limit a specific implementation of the switch 10, but for the convenience of the following description, only the N-MOSFET Mn1 is used as the switch 10 provided by the present disclosure as an example. The N-MOSFET Mn1 is turned on in response to the gate receiving a high potential signal output from the inverter 14 and is turned off in response to the gate receiving a low potential signal output from the inverter 14.

In addition, the inverter 14 outputs a low-level signal in response to a high-level signal being input from the first node N1 to the input terminal of the inverter 14, and the inverter 14 further outputs a high-level signal in response to a low-level signal being input from the first node N1 to the input terminal of the inverter 14. The resistor R1 and the capacitor C are connected in series between the power line PL and the ground line GL to form an RC circuit, and the RC circuit is also connected in parallel with the N-MOSFET Mn1. In other embodiments, the resistor R1 can also be replaced by a P-MOSFET or an N-MOSFET, and the capacitor C can also be replaced by a diode, but the present disclosure is not limited thereto. It should be noted that, in response to a power supply voltage VDD being applied to the power supply line PL to be supplied to the internal circuit 20 of the IC during normal operation, the integrated circuit for power clamping 1 enables a high potential signal from the power supply line PL to be input from the first node N1 to the input terminal of the inverter 14, such that the N-MOSFET Mn1 is turned off.

However, in a case where the integrated circuit for power clamping 1 is provided without the voltage detection circuit 16, after an EOS surge is applied to the power line PL (i.e., an EOS event occurs), the RC circuit charges the capacitor C according to an RC time constant of the resistor R1 and the capacitor C. Since the EOS event is usually last in an order of microseconds, and the RC time constant of the resistor R1 and the capacitor C is also usually set to enable a time required for the capacitor C to be fully charged to be in the order of microseconds, there is a chance that the capacitor C may be fully charged when the EOS event occurs, so that the first node N1 may be in a high potential state to generate a high potential signal to input to the input terminal of the inverter 14, while the N-MOSFET Mn1 is turned off such that no discharge path can be formed. Therefore, the EOS surge current at this time flows into the internal circuit 20 of the IC.

On the other hand, when the voltage of the power line PL rises to a breakdown voltage of the N-MOSFET Mn1, the integrated circuit for power clamping 1 can only form a discharge path through the drain and a base of the N-MOSFET Mn1. However, in the N-MOSFET Mn1, a path from the drain to the base is usually non-uniformly turned on, thereby limiting its discharge capability, so that it can be difficult to prevent the EOS surge current from flowing into the internal circuit 20 of the IC. In order to address the above issues, the integrated circuit for power clamping 1 provided by the present disclosure can electrically connect the first node N1 to the ground line GL through the voltage detection circuit 16 when the EOS event occurs, such that the low potential signal from the ground line GL is input from the first node N1 to the input terminal of the inverter 14, and then the N-MOSFET Mn1 is turned on to form the discharge path. Therefore, the EOS surge current at this time can flow to the ground line GL through the N-MOSFET Mn1.

Figure 2:
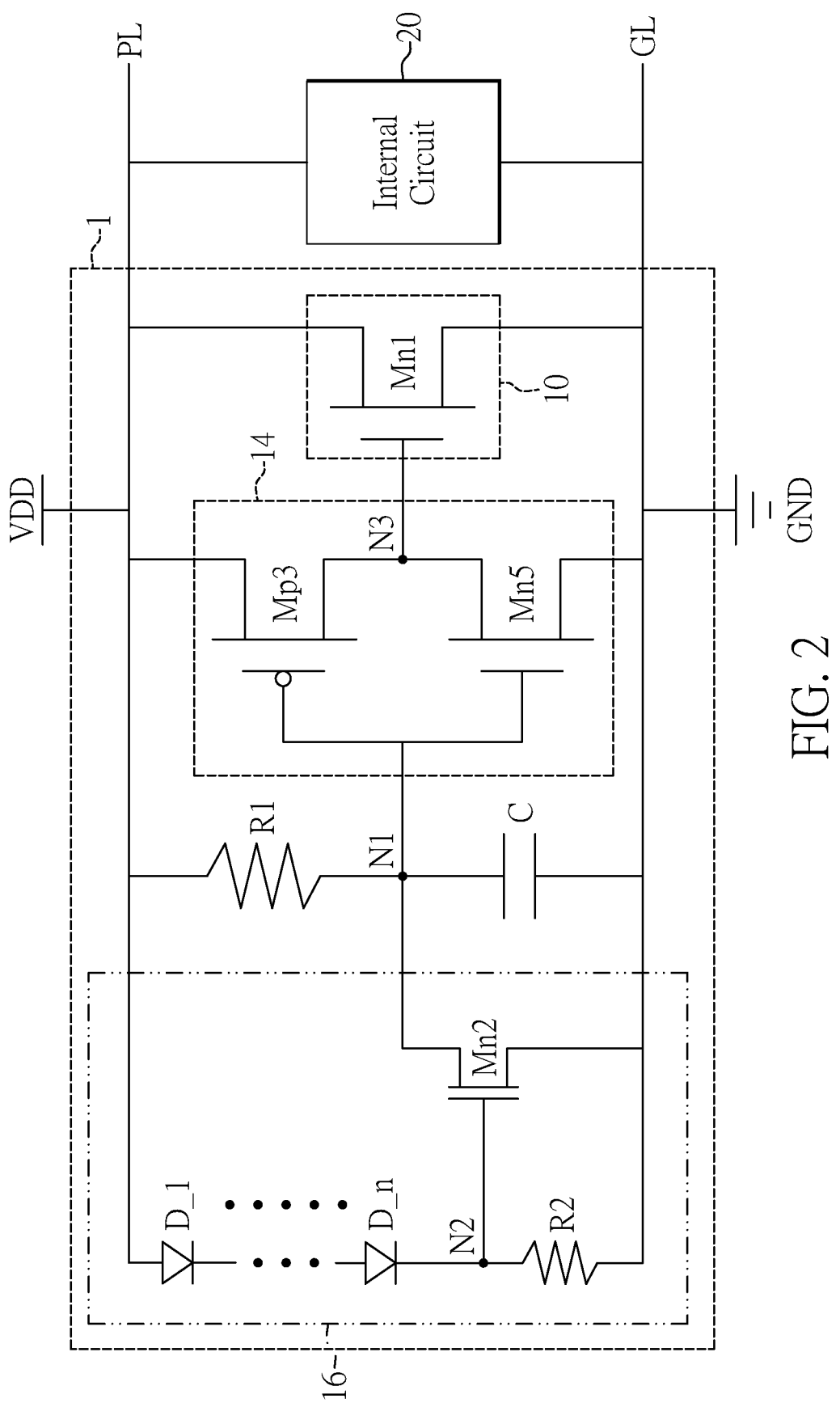
FIG. 2 is a schematic diagram of a voltage detection circuit according to a first embodiment of the present disclosure.

It should be understood that the voltage detection circuit 16 determines that the EOS event occurs in response to detecting that the voltage of the power line PL exceeds a threshold. Therefore, the threshold value is determined according to a voltage defined by the integrated circuit for EOS protection. Next, various specific implementations of the voltage detection circuit 16 are described below while making reference to FIGS. 2 to 6. Reference is made to FIG. 2, which is a schematic diagram of a voltage detection circuit according to a first embodiment of the present disclosure. In the first embodiment, the voltage detection circuit 16 may include a plurality of diodes D_1 to D_n, a resistor R2, and an N-MOSFET Mn2. The diodes D_1 to D_n are connected in series between the power line PL and a second node N2, and n is an integer greater than 1.

Specifically, an anode of a first diode D_1 among the diodes D_1 to D_n is electrically coupled to the power line PL, and a cathode of an n-th diode D_n among the diodes D_1 to D_n is electrically coupled to the second nodes N2, and a cathode of an i-th diode D_i among the diodes D_1 to D_n is electrically coupled to an anode of an (i+1)-th diode D_i+1, where i is an integer from 1 to n−1. In addition, the resistor R2 is electrically coupled between the second node N2 and the ground line GL. A drain of the N-MOSFET Mn2 is electrically coupled to the first node N1, a gate of the N-MOSFET Mn2 is electrically coupled to the second node N2, and a source of the N-MOSFET Mn2 is electrically coupled to the ground line GL.

It can be seen that the diodes D1 to Dn are used as the switch electrically coupled between the power line PL and the second node N2, and a quantity (namely n) of the diodes D1 to Dn is determined according to a threshold voltage of each of the diodes and the power supply voltage VDD supplied to the IC. For example, assuming that the threshold voltage of each diode is 0.8 volts, it means that only when the voltage of the power line PL exceeds (n*0.8) volts, the diodes D_1 to D_n can then all be turned on, that is, at this time, the current can flow to the second node N2 through the diodes D_1 to D_n. Therefore, if the power supply voltage VDD supplied to the IC is 1.8 volts, in the present embodiment, the quantity of the diodes D_1 to D_n can be determined to be 3. Alternatively, if the power supply voltage VDD supplied to the IC is 3.3 volts, in the present embodiment, the quantity of the diodes D_1 to D_n can be determined to be 5. That is, during the normal operation, since the power supply voltage VDD supplied to the IC is less than (n*0.8) volts, the current does not flow to the second node N2 through the diodes D_1 to D_n, such that the N-MOSFET Mn2 is turned off, and the voltage detection circuit 16 will not cause additional current leakage and malfunction.

On the other hand, when the voltage of the power line PL exceeds (n*0.8) volts, the current will flow to the second node N2 through the diodes D_1 to D_n, such that the N-MOSFET Mn2 is turned on, and the voltage detection circuit 16 electrically connects the first node N1 to the ground line GL. Therefore, a low potential signal from the ground line GL is input into the input terminal of the inverter 14 from the first node N1, and then the N-MOSFET Mn1 is turned on to form the discharge path. Since the operating principles of the diodes D_1 to D_n, the resistor R2 and the N-MOSFETs Mn1 and Mn2 are known to those skilled in the art, details of the voltage detection circuit 16 of the first embodiment are omitted hereinafter.

Figure 3:
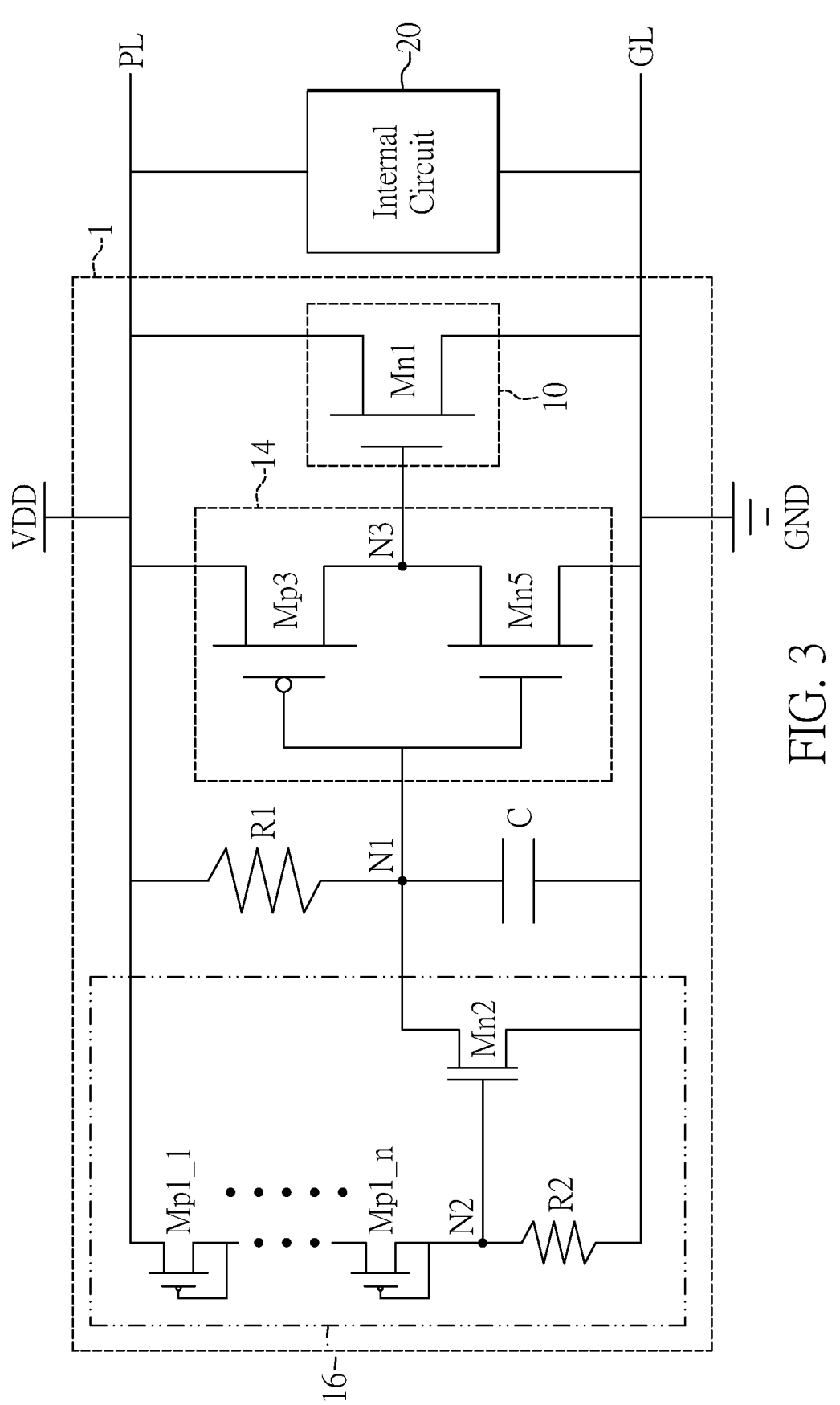
FIG. 3 is a schematic diagram of a voltage detection circuit according to a second embodiment of the present disclosure.

Reference is made to FIG. 3, which is a schematic diagram of a voltage detection circuit according to a second embodiment of the present disclosure. The voltage detection circuit 16 of the second embodiment is similar to the voltage detection circuit 16 of the first embodiment, and thus the similarities between the two embodiments will not be repeated. It should be noted that, different from the first embodiment using the diodes D_1 to D_n as the switch electrically coupled between the power line PL and the second node N2, the second embodiment utilizes a plurality of P-MOSFETs Mp1_1 to Mp1_n to serve as the switch electrically coupled between the power line PL and the second node N2. In other words, the voltage detection circuit 16 of the second embodiment includes the P-MOSFETs Mp1_1 to Mp1_n, a resistor R2 and an N-MOSFET Mn2. The P-MOSFETs Mp1_1 to Mp1_n are connected in series between the power line PL and the second node N2.

Specifically, a source of a first P-MOSFET Mp1_1 among the P-MOSFETs Mp1_1 to Mp1_n is electrically coupled to the power line PL, and a drain of the n-th P-MOSFET Mp1_n among the P-MOSFETs Mp1_1 to Mp1_n is electrically coupled to the second node N2. In addition, a gate and a drain of each of the P-MOSFETs Mp1_1 to Mp1_n are electrically coupled to one another, and a drain of the i-th P-MOSFET MP1_i among the P-MOSFETs Mp1_1 to Mp1_n is electrically coupled to a source of the (i+1)-th P-MOSFET Mp1_i+1 among the P-MOSFETS Mp1_1 to Mp1_n. Therefore, when the voltage of the power line PL exceeds the threshold value, the P-MOSFETs Mp1_1-Mp1_n can be turned on, such that the current flows to the second node N2 through the P-MOSFETs Mp1_1 to Mp1_n, and the N-MOSFET Mn2 is also turned on.

Figure 4:
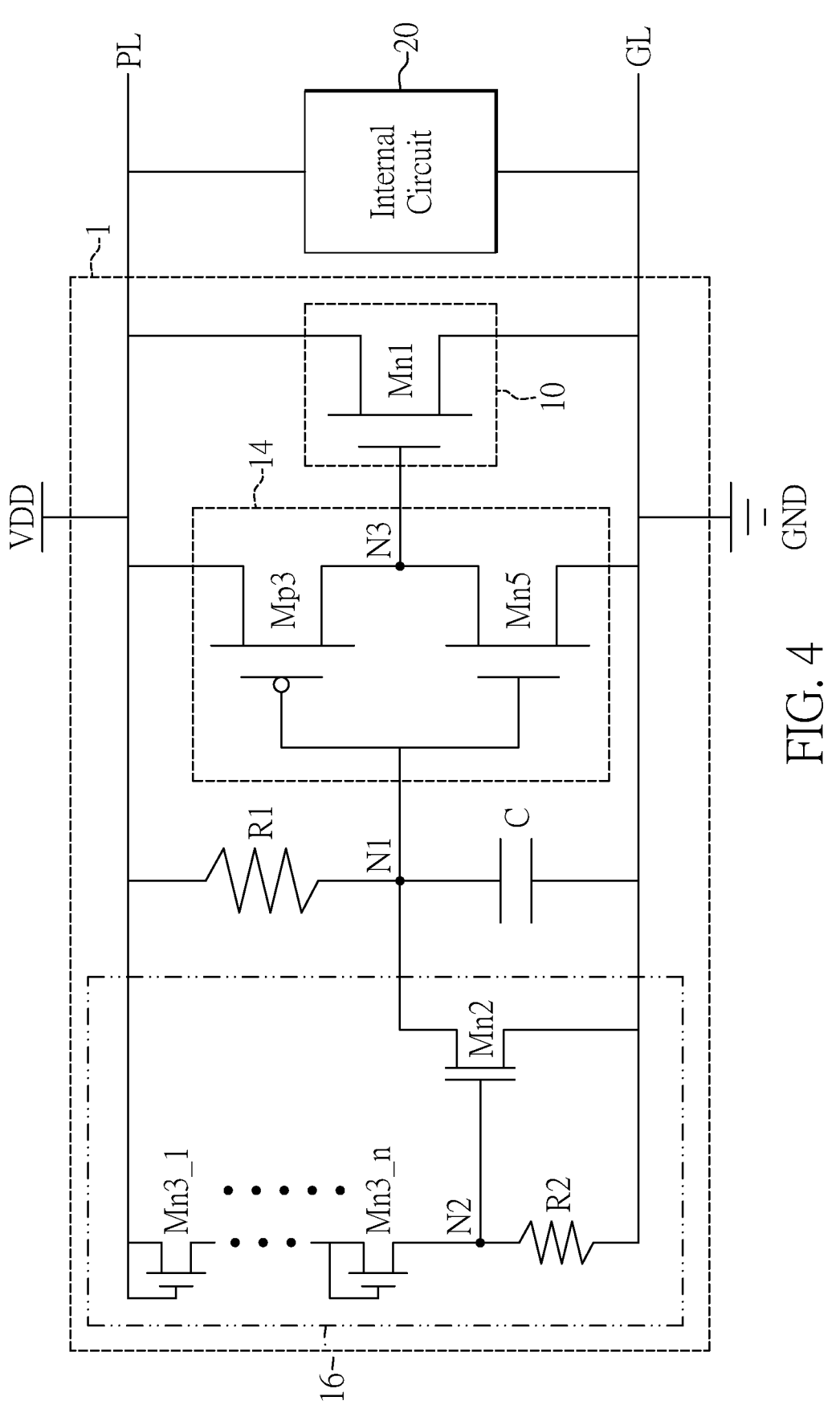
FIG. 4 is a schematic diagram of a voltage detection circuit according to a third embodiment of the present disclosure.

Reference is made to FIG. 4, which is a schematic diagram of a voltage detection circuit according to a third embodiment of the present disclosure. The voltage detection circuit 16 of the third embodiment is also similar to the voltage detection circuit 16 of the second embodiment, and thus the similarities between the two embodiments will not be repeated. It should be noted that, different from the second embodiment using the P-MOSFETs Mp1_1 to Mp1_n as the switch electrically coupled between the power line PL and the second node N2, the third embodiment utilizes a plurality of N-MOSFETs Mn3_1 to Mn3_n to serve as the switch electrically coupled between the power line PL and the second node N2. In other words, the voltage detection circuit 16 of the third embodiment includes the N-MOSFETs Mn3_1 to Mn3_n, a resistor R2 and an N-MOSFET Mn2. The N-MOSFETs Mn3_1 to Mn3_n are connected in series between the power line PL and the second node N2.

Specifically, a source of a first N-MOSFET Mn3_1 among the N-MOSFETs Mn3_1 to Mp3_n is electrically coupled to the power line PL, and a drain of an n-th N-MOSFET Mn3_n among the N-MOSFETs Mn3_1 to Mn3_n is electrically coupled to the second node N2. In addition, a gate and a drain of each of the N-MOSFETs Mn3_1 to Mn3_n are electrically coupled to one another, and a source of an i-th N-MOSFET Mn3_i among the N-MOSFETs Mn3_1 to Mn3_n is electrically coupled to a drain of an (i+1)-th N-MOSFET Mn3_i+1 among the N-MOSFETS Mn3_1 to Mn3_n. Therefore, when the voltage of the power line PL exceeds the threshold value, the N-MOSFETs Mn3_1 to Mn3_n can be turned on, such that the current flows to the second node N2 through the N-MOSFETs Mn3_1 to Mn3_n, and the N-MOSFET Mn2 is also turned on.

Figure 5:
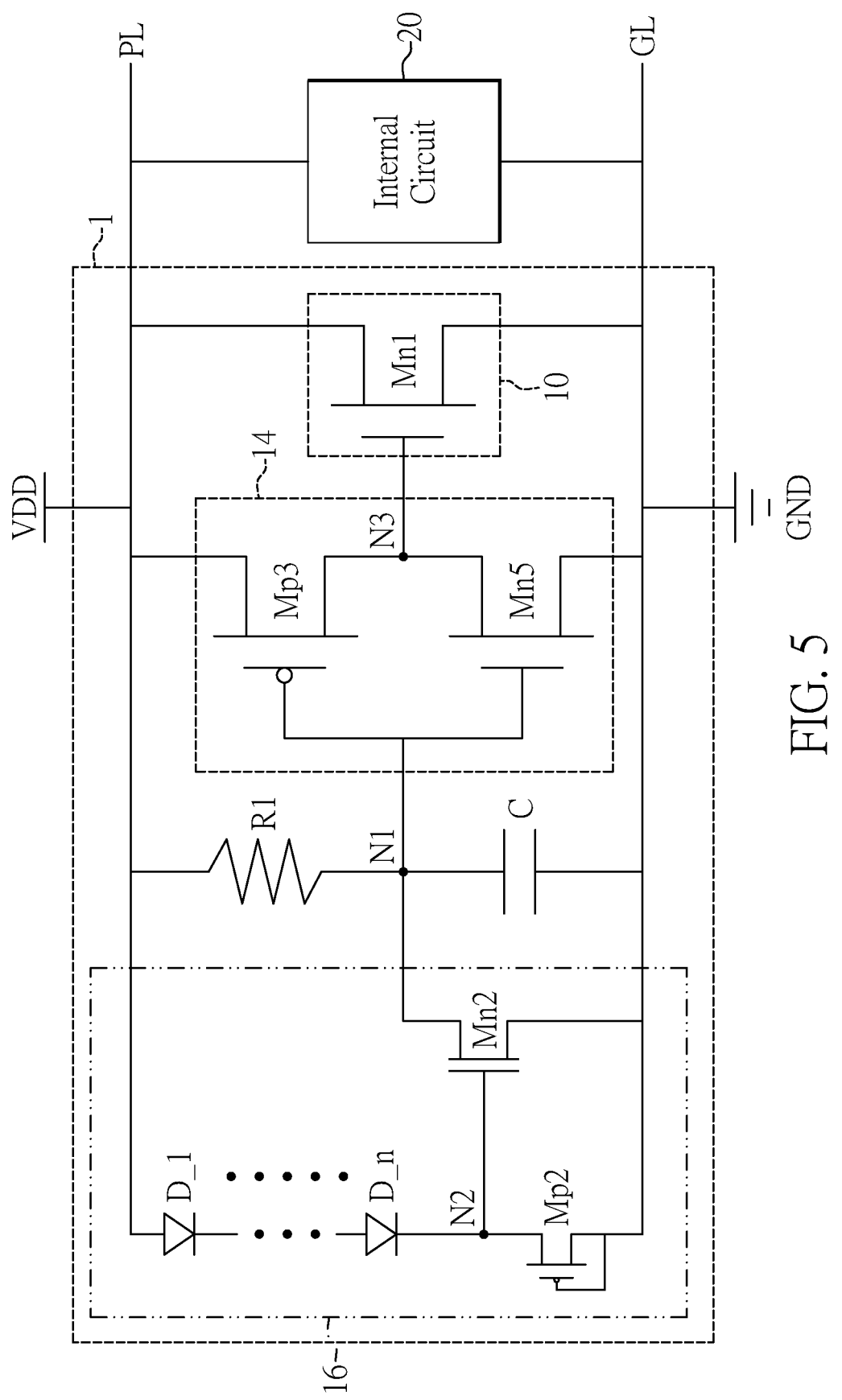
FIG. 5 is a schematic diagram of a voltage detection circuit according to a fourth embodiment of the present disclosure.

Reference is made to FIG. 5, which is a schematic diagram of a voltage detection circuit according to a fourth embodiment of the present disclosure. Different from the first embodiment, the fourth embodiment uses a P-MOSFET Mp2 to replace the resistor R2 and is electrically coupled between the second node N2 and the ground line GL. In other words, the voltage detection circuit 16 of the fourth embodiment includes a plurality of diodes D_1 to D_n, the P-MOSFET Mp2 and an N-MOSFET Mn2. Specifically, a source of the P-MOSFET Mp2 is electrically coupled to the second node N2, a drain of the P-MOSFET Mp2 is electrically coupled to the ground line GL, and a gate and the drain of the P-MOSFET Mp2 are electrically coupled together. Since the operation principle of the P-MOSFET Mp2 replacing the resistor R2 is known to those skilled in the art, details of the fourth embodiment will not be repeated hereinafter.

Figure 6:
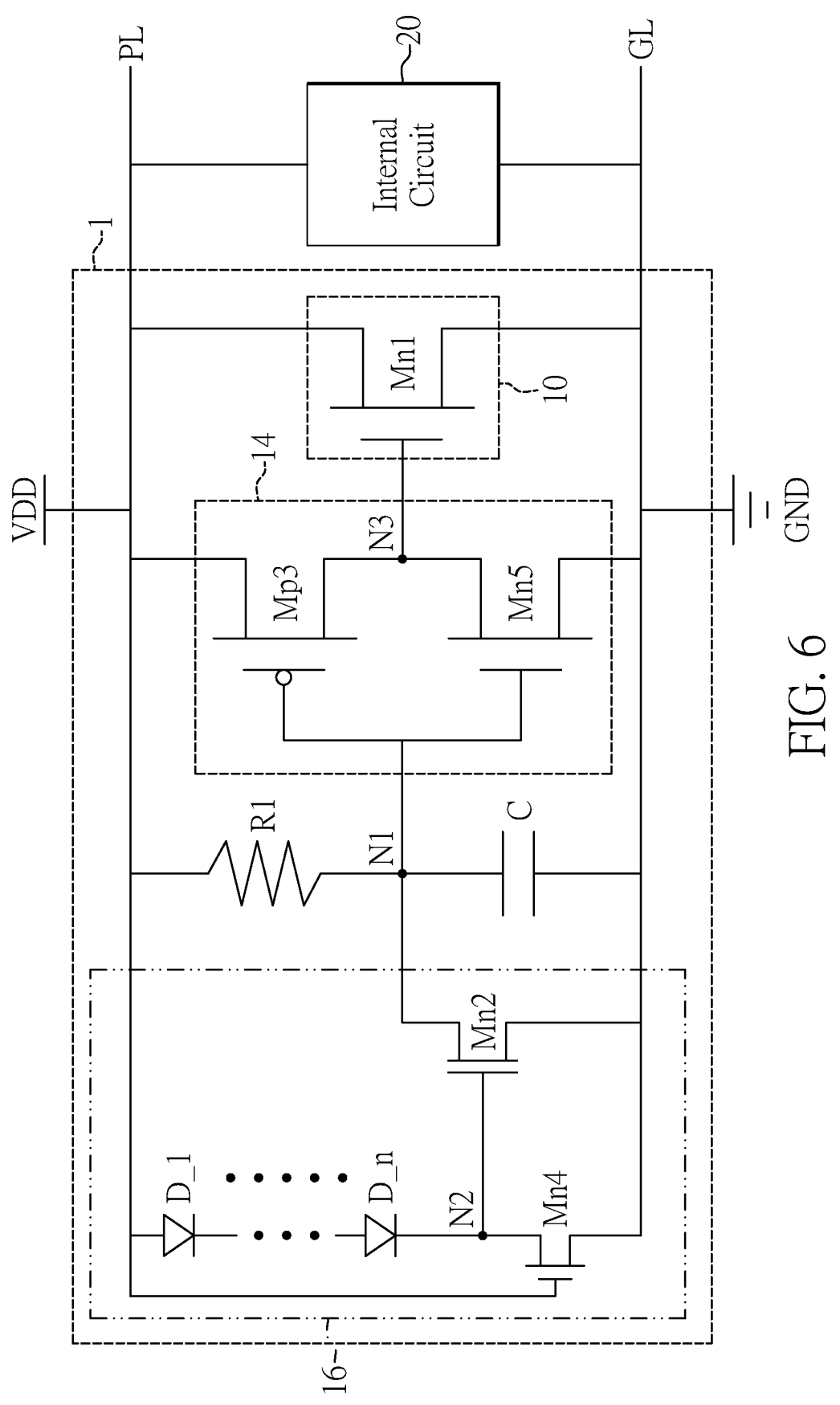
FIG. 6 is a schematic diagram of a voltage detection circuit according to a fifth embodiment of the present disclosure.

Similarly, reference is made to FIG. 6, which is a schematic diagram of a voltage detection circuit according to a fifth embodiment of the present disclosure. Different from the fourth embodiment, the fifth embodiment uses an N-MOSFET Mn4 to replace the resistor R2, and the N-MOSFET Mn4 is electrically coupled between the second node N2 and the ground line GL. In other words, the voltage detection circuit 16 of the fifth embodiment includes a plurality of diodes D_1 to D_n, a N-MOSFET Mn2 and the N-MOSFET Mn4. Specifically, a drain of the N-MOSFET Mn4 is electrically coupled to the second node N2, a source of the N-MOSFET Mn4 is electrically coupled to the ground line GL, and a gate of the N-MOSFET Mn4 is electrically coupled to the power line PL. Since the operation principle of replacing the resistor R2 by the N-MOSFET Mn4 is known to those skilled in the art, details of the fifth embodiment will not be repeated hereinafter.

On the other hand, the inverter 14 can be a static complementary metal oxide semiconductor (CMOS) inverter, but the present disclosure is not limited thereto. The static CMOS inverter includes a P-MOSFET Mp3 and an N-MOSFET Mn5. A source of the P-MOSFET Mp3 is electrically coupled to the power line PL, a gate of the P-MOSFET Mp3 is electrically coupled to the first node N1, and a drain of the P-MOSFET Mp3 is electrically coupled to a gate of the N-MOSFET Mn1 through the third node N3. In addition, a source of the N-MOSFET Mn5 is electrically coupled to the ground line GL, a gate of the N-MOSFET Mn5 is electrically coupled to the gate of the P-MOSFET Mp3, and a drain of the N-MOSFET Mn5 is electrically coupled to the third node N3. Since the operation principle of the static CMOS inverter is known to those skilled in the art, the details thereof will not be repeated hereinafter.

Furthermore, in addition to the N-MOSFET or the NPN-BJT, the switch 10 can also be a P-MOSFET or a PNP BJT. In this case, since the switch 10 is turned on in response to the control terminal receiving the low potential signal, the integrated circuit for power clamping 1 provided by the present disclosure can further include an odd number of inverters electrically coupled between the input terminal of the inverter 14 and the control terminal of the switch 10, such that the P-MOSFET or the PNP BJT that is taken as the switch 10 can also be turned on to form a discharge path when the EOS event occurs. The odd number of the inverters can be implemented in the same manner as the inverter 14, but the present disclosure is not limited thereto.

In conclusion, in the integrated circuit for power clamping provided by the present disclosure, the first node can be connected to the ground line through the voltage detection circuit when the EOS event occurs, such that the low potential signal from the ground line can be input to the input terminal of the inverter from the first node, and the N-MOSFET can then be turned on to form the discharge path.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An integrated circuit for power clamping, electrically coupled to an internal circuit of another integrated circuit through a power line and a ground line, the integrated circuit for power clamping comprising:
   a switch electrically coupled between the power line and the ground line, the switch having a control terminal; wherein the switch is a first N-channel metal-oxide-semiconductor field-effect transistor (N-MOSFET);

a first resistor electrically coupled between the power line and a first node;
   a capacitor electrically coupled between the first node and the ground line;
   an inverter electrically coupled between the first node and the control terminal of the switch, wherein an input terminal of the inverter is electrically coupled to the first node, and an output terminal of the inverter is electrically coupled to the control terminal of the switch; and
   a voltage detection circuit electrically coupled to the power line, the first node and the ground line, wherein the voltage detection circuit is configured to detect whether a voltage of the power line exceeds a threshold value, wherein when the voltage of the power line exceeds the threshold, the voltage detection circuit electrically couples the first node with the ground line, such that the input terminal of the inverter electrically coupled with the first node is pulled low to activate the switch and forming a discharge path in the switch;
   wherein the voltage detection circuit includes:
   a second N-MOSFET, wherein a drain of the second N-MOSFET is electrically coupled to the first node, a gate of the second N-MOSFET is electrically coupled to a second node, and a source of the second N-MOSFET is electrically coupled to the ground line;
   an impedance component electrically coupled between the second node and the ground line; and
   a plurality of third N-MOSFETs being connected in series between the power line and the second node.

2. The integrated circuit for power clamping according to claim 1, wherein a drain of the first N-MOSFET is electrically coupled to the power line, a source of the first N-MOSFET is electrically coupled to the ground line, and a gate of the first N-MOSFET is taken as the control terminal electrically coupled to the output terminal of the inverter.

3. The integrated circuit for power clamping according to claim 2, wherein the threshold value is determined according to a voltage defined by the integrated circuit for electrical overstress (EOS) protection.

4. The integrated circuit for power clamping according to claim 1, wherein the impedance component is a second resistor.

5. The integrated circuit for power clamping according to claim 4, wherein the inverter is a static complementary metal-oxide-semiconductor (CMOS) inverter, and includes:
   a first P-MOSFET, wherein a source of the first P-MOSFET is electrically coupled to the power line, and a gate of the first P-MOSFET is electrically coupled to the first node, and a drain of the first P-MOSFET is electrically coupled to the gate of the first N-MOSFET through a third node; and
   a fourth N-MOSFET, wherein a source of the fourth N-MOSFET is electrically coupled to the ground line, and a gate of the third N-MOSFET is electrically coupled to the gate of the first P-MOSFET, and a drain of the fourth N-MOSFET is electrically coupled to the third node.

6. An integrated circuit for power clamping, electrically coupled to an internal circuit of another integrated circuit through a power line and a ground line, the integrated circuit for power clamping comprising:
   a switch electrically coupled between the power line and the ground line, the switch having a control terminal; wherein the switch is a first N-channel metal-oxide-semiconductor field-effect transistor (N-MOSFET);

a first resistor electrically coupled between the power line and a first node;

a capacitor electrically coupled between the first node and the ground line;

an inverter electrically coupled between the first node and the control terminal of the switch, wherein an input terminal of the inverter is electrically coupled to the first node, and an output terminal of the inverter is electrically coupled to the control terminal of the switch; and a voltage detection circuit electrically coupled to the power line, the first node and the ground line, wherein the voltage detection circuit is configured to detect whether a voltage of the power line exceeds a threshold value, wherein when the voltage of the power line exceeds the threshold, the voltage detection circuit electrically couples the first node with the ground line, such that the input terminal of the inverter electrically coupled with the first node is pulled low to activate the switch and forming a discharge path in the switch;

wherein the voltage detection circuit further includes:

a second N-MOSFET, wherein a drain of the second N-MOSFET is electrically coupled to the first node, a gate of the second N-MOSFET is electrically coupled to a second node, and a source of the second N-MOS-FET is electrically coupled to the ground line;

a first P-MOSFET, wherein a drain of the first P-MOSFET is electrically coupled to the second node, a source of the first P-MOSFET is electrically coupled to the ground line, and a gate of the first P-MOSFET is electrically coupled to the source of the first P-MOS-FET; and a threshold setting circuit coupled between the power line and the second node.

7. The integrated circuit for power clamping according to claim 6, wherein the inverter is a static complementary metal-oxide-semiconductor (CMOS) inverter, and includes:

a second P-MOSFET, wherein a source of the second P-MOSFET is electrically coupled to the power line, a gate of the second P-MOSFET is electrically coupled to the first node, and a drain of the second P-MOSFET is electrically coupled to the gate of the first N-MOSFET through a third node; and a third N-MOSFET, wherein a source of the third N-MOSFET is electrically coupled to the ground line, a gate of the third N-MOSFET is electrically coupled to the gate of the second P-MOSFET, and a drain of the third N-MOSFET is electrically coupled to the third node.

8. The integrated circuit for power clamping according to claim 6, wherein the threshold setting circuit is a plurality of diodes connected in series.

9. An integrated circuit for power clamping, electrically coupled to an internal circuit of another integrated circuit through a power line and a ground line, the integrated circuit for power clamping comprising:

a switch electrically coupled between the power line and the ground line, the switch having a control terminal; wherein the switch is a first N-channel metal-oxide-semiconductor field-effect transistor (N-MOSFET);

a first resistor electrically coupled between the power line and a first node;

a capacitor electrically coupled between the first node and the ground line;

an inverter electrically coupled between the first node and the control terminal of the switch, wherein an input terminal of the inverter is electrically coupled to the first node, and an output terminal of the inverter is electrically coupled to the control terminal of the switch; and a voltage detection circuit electrically coupled to the power line, the first node and the ground line, wherein the voltage detection circuit is configured to detect whether a voltage of the power line exceeds a threshold value, wherein when the voltage of the power line exceeds the threshold, the voltage detection circuit electrically couples the first node with the ground line, such that the input terminal of the inverter electrically coupled with the first node is pulled low to activate the switch and forming a discharge path in the switch;

wherein the voltage detection circuit further includes:

a second N-MOSFET, wherein a drain of the second N-MOSFET is electrically coupled to the first node, a gate of the second N-MOSFET is electrically coupled to a second node, and a source of the second N-MOS-FET is electrically coupled to the ground line;

a third N-MOSFET, wherein a drain of the third N-MOS-FET is electrically coupled to the second node, a source of the third N-MOSFET is electrically coupled to the ground line, and a gate of the third N-MOSFET is electrically coupled to the power line; and a threshold setting circuit coupled between the power line and the second node.

10. The integrated circuit for power clamping according to claim 9, wherein the inverter is a static complementary metal-oxide-semiconductor (CMOS) inverter, and includes:

a first P-MOSFET, wherein a source of the first P-MOS-FET is electrically coupled to the power line, a gate of the first P-MOSFET is electrically coupled to the first node, and a drain of the first P-MOSFET is electrically coupled to the gate of the first N-MOSFET through a third node; and a fourth N-MOSFET, wherein a source of the fourth N-MOSFET is electrically coupled to the ground line, a gate of the third N-MOSFET is electrically coupled to the gate of the first P-MOSFET, and a drain of the fourth N-MOSFET is electrically coupled to the third node.

11. The integrated circuit for power clamping according to claim 9, wherein the threshold setting circuit is a plurality of diodes connected in series.

\* \* \* \* \*